United States Patent
Lee et al.

(10) Patent No.: US 8,043,429 B2
(45) Date of Patent: Oct. 25, 2011

(54) METHOD FOR FABRICATING FILAMENT TYPE HIGH-TEMPERATURE SUPERCONDUCTING WIRE

(75) Inventors: Hee Gyoun Lee, Uiwang-si (KR); Gye Won Hong, Seongnam-si (KR); Kyeong Dal Choi, Seoul (KR)

(73) Assignee: Korea Polytechnic University (KR)

( * ) Notice: Subject to any disclaimer, the term of this patent is extended or adjusted under 35 U.S.C. 154(b) by 1185 days.

(21) Appl. No.: 11/692,240

(22) Filed: Mar. 28, 2007

(65) Prior Publication Data

US 2008/0113870 A1 May 15, 2008

(30) Foreign Application Priority Data

Nov. 10, 2006 (KR) .................. 10-2006-0110765

(51) Int. Cl.
*C30B 21/04* (2006.01)
(52) U.S. Cl. .............. 117/89; 117/95; 117/96; 117/101; 117/104
(58) Field of Classification Search .................. 117/89, 117/95, 96, 101, 104
See application file for complete search history.

(56) References Cited

U.S. PATENT DOCUMENTS

| | | | |
|---|---|---|---|
| 2004/0250651 A1* | 12/2004 | Goyal et al. | 75/245 |
| 2007/0238619 A1* | 10/2007 | Xiong | 505/100 |

OTHER PUBLICATIONS

Stability of Superconductors; Lawrence Dresner; Kluwer Academic Publishers; (1995).

* cited by examiner

*Primary Examiner* — Bob M Kunemund
(74) *Attorney, Agent, or Firm* — Hershkovitz & Associates, LLC; Abraham Hershkovitz

(57) ABSTRACT

The present invention relates to a method for fabricating a filament type high-temperature superconducting wire in which a thin film type high-temperature superconducting wire is fabricated into a filament shape suitable for use with alternating current. The method includes depositing a conducting ceramic or metal epitaxially on a metal substrate 10 having bi-axially textured property to deposit a conductive thin film layer 20 (S10); depositing silver, copper, nickel, silver and copper, or a nickel alloy epitaxially on the deposited conductive thin film layer 20 to deposit a metal layer 30 (S20); cutting the deposited metal layer 30 into a filament shape having a predetermined width using a laser, a slitter, or etching and separating the cut metal layer from the conductive film layer 20 by selective etching, stress generation, or a difference in thermal expansion coefficients to form a metal filament 40 (S30); coating a single layer or multi-layers of a ceramic buffer layer 41 on the outside of the separated metal filament 40 (S40); coating a superconducting layer 42 on the outside of the ceramic buffer layer 41 (S50); and coating a single layer or multi-layers of a metal protective layer 43 on the outside of the superconducting layer 42 (S60).

12 Claims, 6 Drawing Sheets

(a)

| |
|---|
| SECOND METAL LAYER |
| FIRST METAL LAYER |
| SUPERCONDUCTING LAYER |
| THIRD CERAMIC LAYER |
| SECOND CERAMIC LAYER |
| FIRST CERAMIC LAYER |
| BI-AXIALLY TEXTURED METAL SUBSTRATE |

(b)

| |
|---|
| SECOND METAL LAYER |
| FIRST METAL LAYER |
| SUPERCONDUCTING LAYER |
| THIRD CERAMIC LAYER |
| IBAD LAYER |
| SECOND CERAMIC LAYER |
| FIRST CERAMIC LAYER |
| METAL SUBSTRATE |

| COUNDUCTIVE THIN FILM LAYER 20 |
|---|
| THIRD CERAMIC LAYER 14 |
| IBAD LAYER 13 |
| SECOND CERAMIC LAYER 12 |
| FIRST CERAMIC LAYER 11 |
| METAL SUBSTRATE 10 |

(b)

| METAL LAYER 30 |
|---|
| CONDUCTIVE THIN FILM LAYER 20 |
| THIRD CERAMIC LAYER 14 |
| IBAD LAYER 13 |
| SECOND CERAMIC LAYER 12 |
| FIRST CERAMIC LAYER 11 |
| METAL SUBSTRATE 10 |

FIG. 3

METHOD FOR FABRICATING FILAMENT TYPE HIGH-TEMPERATURE SUPERCONDUCTING WIRE

BACKGROUND OF THE INVENTION

1. Field of the Invention

The present invention relates to a method for fabricating a filament type high-temperature superconducting wire, and more particularly to a method for fabricating a filament type high-temperature superconducting wire in which a thin film type high-temperature superconducting wire is fabricated into a filament shape suitable for use with alternating current.

2. Description of the Related Art

Superconductive phenomenon refers to which resistance of a substance disappears when the temperature of the substance is lowered. That is, when a substance exhibiting superconductive phenomenon is used electricity can flow without generating heat, thus there is no energy loss. Such a substance is called a superconductor. Superconductive phenomenon is exhibited in certain substances and not influenced by temperature, magnetic field, or current. A superconductor can flow a current without resistance only under the superconductive transition temperature (Tc) and critical magnetic field (Bc). Under these circumstances, the critical current density (Ic), which is the highest current density capable of flowing current without resistance, exists.

In incorporating a superconductor, it is advantageous to fabricate the superconductor into a linear or tape shape and in use by the same applicable equipments manufactured by fabricating transmission lines superconductive magnets and the like can be used. In the case of a thin film type high-temperature superconducting wire, it is made into a tape shape having small thickness. Conventionally, the structure of a thin film type high-temperature superconducting wire is fabricated by coating a single layer or multi-layers of a ceramic layer on a metal substrate having a tape shape, coating a superconductive layer followed by a metal layer on the ceramic layer, as shown in FIG. 1A. Metal substrate used herein is a bi-axially textured metal substrate or a metal substrate having no specifically orientated texture. In the latter case, a bi-axially textured ceramic layer is coated on the metal substrate using ion beam assisted deposition (IBAD). The thin film type high-temperature superconducting wire is fabricated by preparing a metal substrate coated with one or two or more ceramic layers epitaxially on a metal substrate having a bi-axially textured surface, and coating a superconductive layer epitaxially on the ceramic layer. On the surface of the fabricated thin film type high-temperature superconducting wire, a metal layer having good conductivity is coated to thermally and mechanically protect the high-temperature superconducting thin film. Thus, the final thin film type high-temperature superconducting wire is completely formed.

FIG. 1B illustrates the structure of a thin film type high-temperature superconducting wire fabricated by coating a single layer or multi-layers of a ceramic layer on a metal substrate having no specifically oriented texture, coating and IBAD layer having bi-axially textured property followed by a ceramic layer, and then coating a superconducting layer and a metal layer sequentially thereon.

The bi-axially textured metal substrate is prepared via rolling a metal or a metal alloy having a face-centered cubic structure followed by heat treatment, and has a tape shape with small thickness and wide width. Similarly, the metal substrate, which has no specifically oriented texture, while having a bi-axially textured ceramic thin film coated by ion beam assisted deposition or an IBAD layer having bi-axially textured property also has a tape shape with small thickness and wide width. Therefore, the final thin film type high-temperature superconducting wire also has a tape shape with small thickness and wide width.

A superconducting wire can be incorporated into electric power lines, motors, transformers, fault current limiters, MRI magnets, NMR magnets and the like, in these uses, a direct current or alternating current power is used. When using a superconducting wire with alternating current, the direction of the current changes continuously such as to generate AC loss, thereby power loss occurs. Therefore, it is very important to reduce the AC loss of the superconducting wire. As a method for reducing the AC loss of the superconducting wire into a filament shape and twisting the filament may reduce the AC loss dramatically. Also, a multiple core wire is used as the superconducting wire for the stability of the superconductor (Lawrence Dresner, "Stability of Superconductor," Plenum Press, New York, N.Y. (1995)). Superconductive current flows through the superconducting filament in the multiple core superconducting wire.

However, as directed above, in the conventional method for fabricating a think film type high-temperature superconducting wire, there are problems in that it is difficult to use the wire in a twisted form and the AC loss is big because the final shape of the wire has a tape shape with small thickness and wide width; the disadvantage in the formability is generated when incorporating the wire into a solenoid coil, a pancake coil, or a cable; and the cross-sectional area of the superconducting wire occupying the total cross-sectional area of the wire is small.

SUMMARY OF THE INVENTION

Therefore, the present invention has been made in view of the above problems, and it is an object of the present invention to provide a method for fabricating a filament type high-temperature superconducting wire which fabricates a think film type high-temperature superconducting wire in a filament shape having the cross-section in a square or approximately a square shape, and which can be twisted using the thin film type high-temperature superconducting wire.

It is another object of the present invention to provide a method for fabricating a filament type high-temperature superconducting wire in which a ceramic buffer layer, a superconducting layer, and a metal protective layer are coated sequentially on the squared surface of a thin film type high-temperature superconducting wire to increase the proportion of the superconductor so that the surface area capable of the flowing current is large and the wire is easily twisted, thereby the AC loss is reduced.

In accordance with the present invention, the above and other objects can be accomplished by the provision of a method for fabricating a filament type high-temperature superconducting wire comprising: depositing a conductive ceramic or metal epitaxially on a metal substrate having bi-axially textured property to deposit a conductive think film layer; depositing silver, copper, nickel, silver and copper, or a nickel alloy epitaxially on the deposited conductive thin film layer to deposit a metal layer; cutting the deposited metal layer into a filament shape having a predetermined width using a layer from the conductive think film layer by selective etching, stress generation, or a difference in thermal expansion coefficients to form a metal filament; coating a single layer or multi-layers of a ceramic buffer layer on the outside of the separated metal filament; coating a superconducting layer on the outside of the ceramic buffer layer; and coating a single layer or multi-layers of a metal protective layer on the outside of the superconducting layer.

It is preferred that the filament type high-temperature superconducting wire has a cross sectional axial ratio defined between 1:1 and 1:2.

It is preferred that the filament type high-temperature superconducting wire has a square or circle shape.

It is preferred that the conductive thin film layer is selected from silver, copper, nickel, or an electrode material (a conductive ceramic such as ITO or FTO) and coated using a method selected from physical disposition (sputtering, evaporation, pulsed laser deposition), metalorganic chemical vapor deposition, chemical deposition (spray pyrolysis method), electroplating, or electroless deposition, alone or in combination.

It is preferred that the metal layer is coated using a method selected from physical deposition (sputtering, evaporation, pulsed laser deposition), metalorganic chemical vapor deposition, chemical deposition (spray pyrolysis method), electroplating, or electroless deposition, alone or in combination.

It is preferred that the ceramic buffer layer is coated using a method selected from physical deposition (sputtering, evaporation, pulsed laser deposition), metalorganic chemical vapor deposition, chemical deposition (spray pyrolysis method), or metalorganic deposition, alone or in combination.

It is preferred that the superconducting layer is coated using a method selected from physical deposition (sputtering, evaporation, pulsed laser deposition), metalorganic chemical vapor deposition, chemical deposition (spray pyrolysis method), or metalorganic deposition, alone or in combination.

It is preferred that the metal protective layer is coated using a method selected from physical deposition (sputtering, evaporation, pulsed laser deposition), metalorganic chemical vapor deposition, chemical deposition (spray pyrolysis method), or metalorganic deposition, alone or in combination.

It is preferred that any one layer among multi-layers of the metal protective layer comprises a metal or metal alloy layer having low electric conductivity to reduce coupling loss between the filaments.

FIG. 2 is a schematic view illustrating a method for fabricating a filament type high-temperature superconducting wire according to the present invention; FIG. 3 is a mimetic diagram of coating a conductive thin film and a metal layer on a bi-axially textured metal substrate according to the present invention; FIG. 4 is a mimetic diagram of fabricating the coated metal layer on the bi-axially textured metal substrate into a filament according to the present invention; FIG. 5 is a mimetic diagram illustrating the process of fabricating a thin film type high-temperature superconducting wire using the bi-axially textured metal filament substrate according to the present invention; and FIG. 6 is a cross sectional view of various thin film type high-temperature superconducting wires being fabricated according to the present invention.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a diagram illustrating a structure of conventional superconducting wire;

FIG. 3 is a mimetic diagram of coating a conductive thin film and a metal layer on a bi-axially textured metal substrate according to the present invention;

DESCRIPTION OF THE PREFERRED EMBODIMENTS

Preferred embodiments of the invention will now be described in detail with reference to the accompanying drawings.

Figure 2:
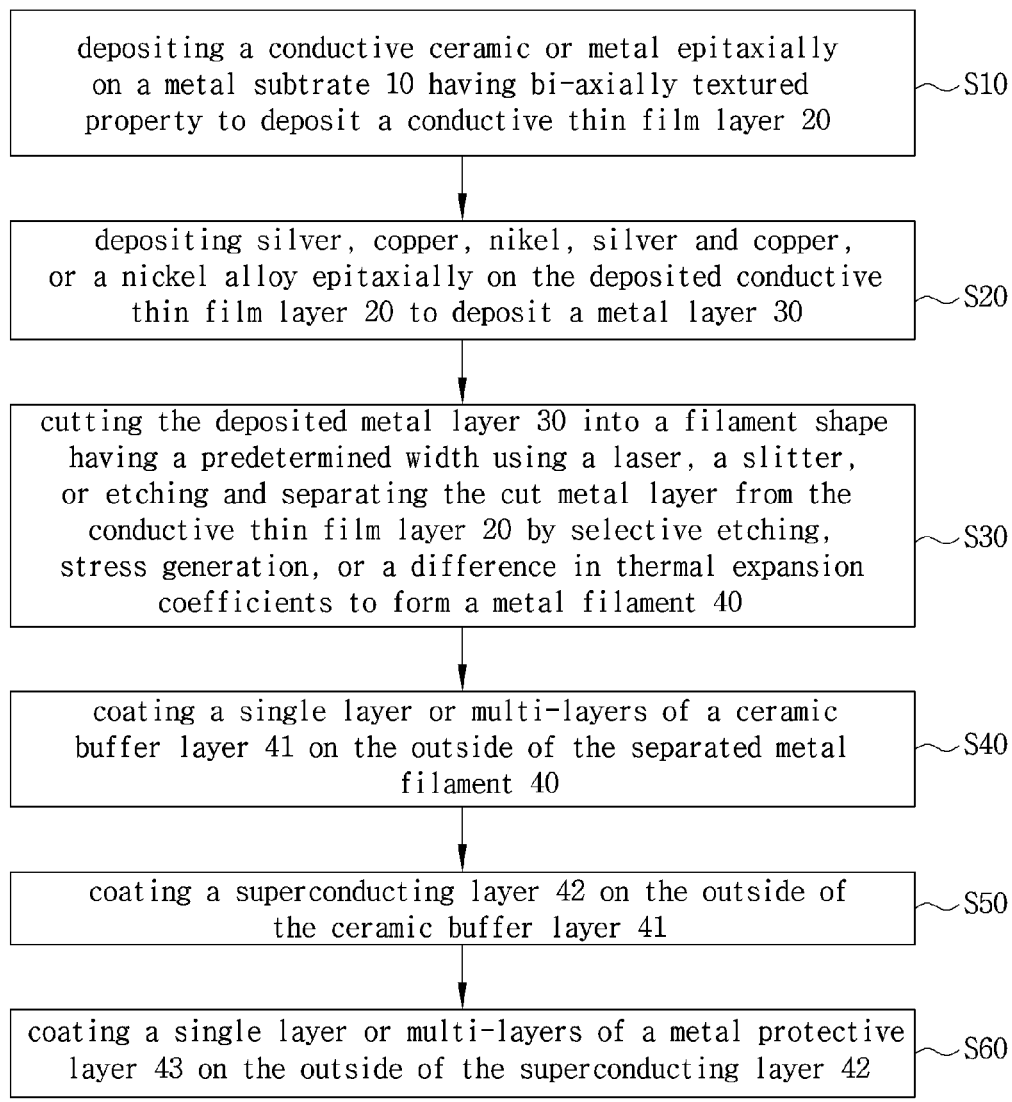
FIG. 2 is a schematic a schematic view illustrating a method for fabricating a filament type high-temperature superconducting wire according to the present invention.

FIG. 2 is a schematic a schematic view illustrating a method for fabricating a filament type high-temperature superconducting wire of the present invention. In accordance with the method, a first ceramic layer 11 and a second ceramic layer 12 are coated on a metal substrate 10 prepared by an ion beam assisted deposition method, and an IBAD layer 13 having a bi-axially textured property and a third ceramic layer 14 are coated sequentially on the second ceramic layer 12.

A conductive thin film 20 is deposited on the metal substrate 10 having bi-axially textured property as in FIG. 3A. For the conductive thin film 20, a conductive ceramic selectively using silver, copper, nickel, or an electrode material (a conductive ceramic such as ITO or FTO) is deposited epitaxially. The deposition of the conductive thin film 20 used herein is selected from physical deposition (sputtering, evaporation, pulsed laser deposition), metalorganic chemical vapor deposition, chemical deposition (spray pyrolysis method), electroplating or electroless deposition, alone or in combination (S10).

On the deposited conductive thin film layer 20, a metal layer 30 using silver, copper, nickel, silver and copper, or a nickel alloy is deposited epitaxially as in FIG. 3B. The deposition used herein is selected from physical deposition (sputtering, evaporation, pulsed laser deposition), metalorganic chemical vapor deposition, chemical deposition (spray pyrolysis method), electroplating or electroless deposition, alone or in combination.

Bi-axially textured property close to a single crystal, which the metal substrate 10 has, is transferred to the upper layers where the conductive thin film 20 and the metal layer 30 also possess bi-axially textured properties.

Figure 4:
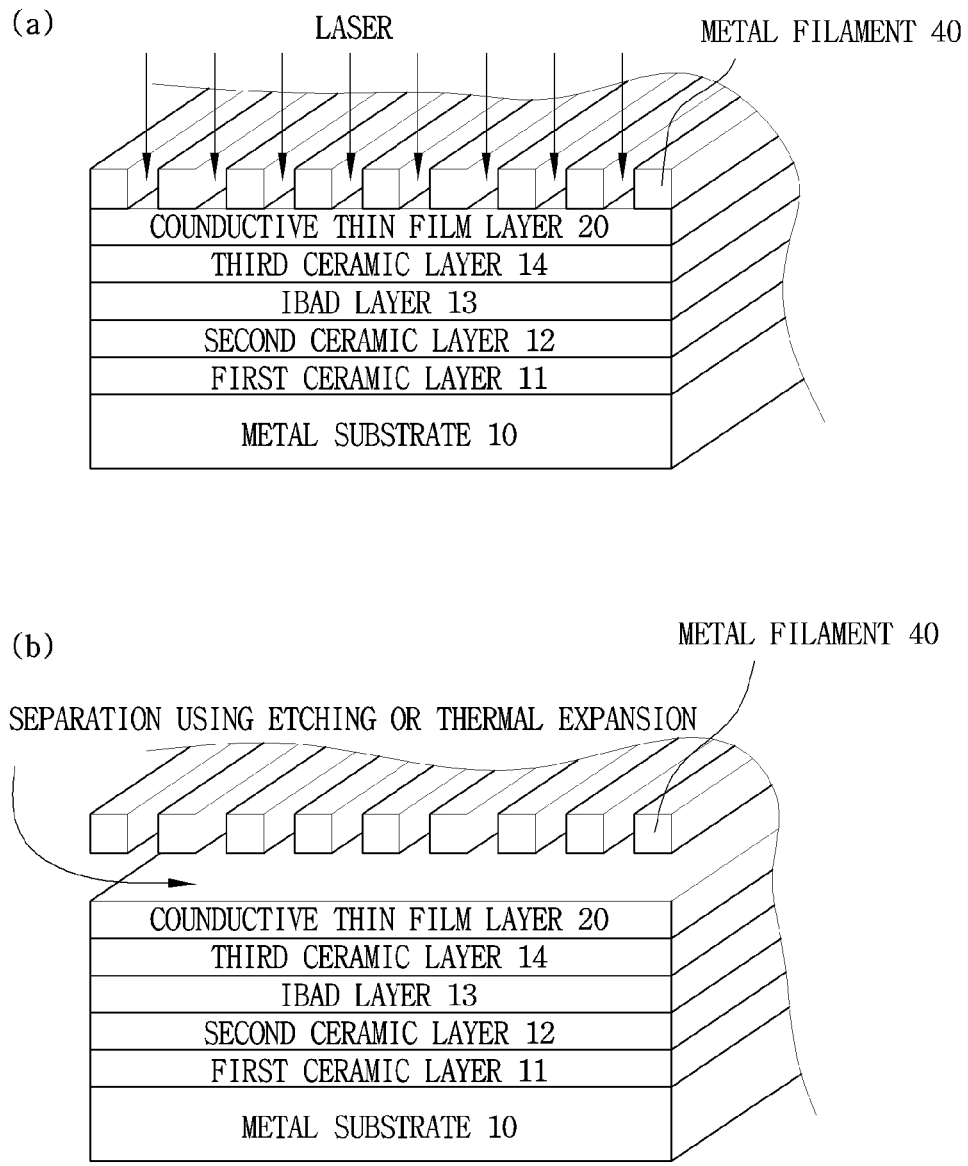
FIG. 4 is a mimetic diagram of fabricating the coated metal layer on the bi-axially textured metal substrate into a filament according to the present invention.

The deposited metal layer 30 is cut into a filament shape with a predetermined width using a laser, a slitter, or etching as in FIG. 4A. The cut metal layer is formed into a metal filament 40 by separating the same from the conductive thin film layer 20 using selective etching, stress generation, or thermal expansion as in FIG. 4B (S30).

If necessary, the filament can have a smooth surface by polishing the surface of the filament.

Figure 5:
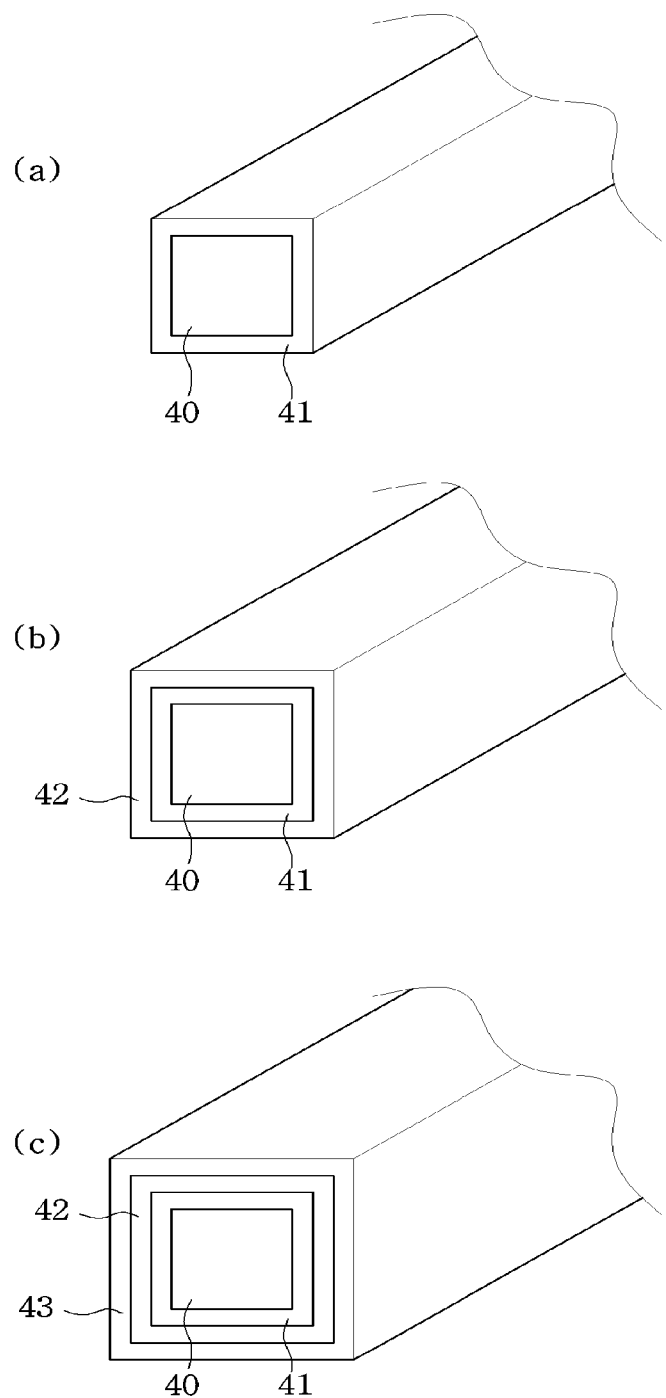
FIG. 5 is a mimetic diagram illustrating the process of fabricating a thin film type high-temperature superconducting wire using the bi-axially textured metal filament substrate according to the present invention.
Figure 6:
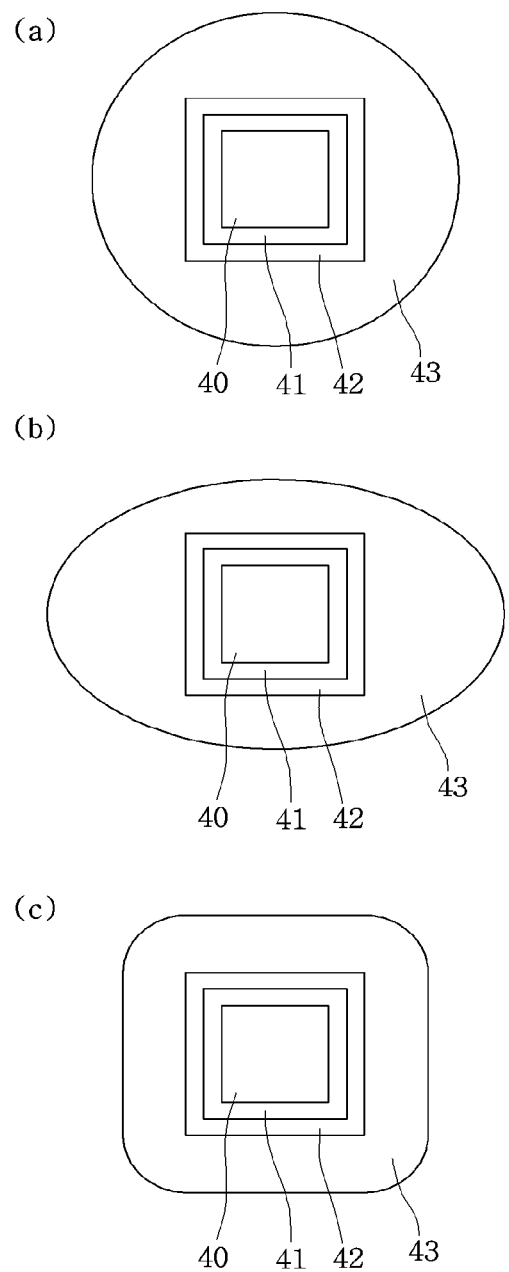
FIG. 6 is a cross sectional view of the various thin film type high-temperature superconducting wires being fabricated according to the present invention.

On the outside of the separated metal filament 40, a single layer or multi-layers of ceramic buffer layer 41 is coated epitaxially as in FIG. 5A, and the deposition used herein is selected from physical deposition (sputtering, evaporation, pulsed laser deposition), metalorganic chemical vapor deposition, chemical deposition (spray pyrolysis method), or metalorganic deposition, alone or in combination (S40).

On the outside of the ceramic buffer layer 41, a superconducting layer 42 is coated as in FIG. 5B, and the deposition used herein is selected from physical disposition (sputtering, evaporation, pulsed laser deposition), metalorganic chemical vapor deposition, chemical deposition (spray pyrolysis method), or metalorganic deposition, alone or in combination (S50).

The superconducting layer 42 may be coated on the whole four sides of the metal filament 40 as described above while having the ceramic buffer layer 41 coated outside the metal filament 40, and depending on a using method, the metal filament 40 may be used with one or more sides coated with the superconducting layer 42.

On the outside of the superconducting layer 42, a single layer or multi-layers of a metal protective layer 43 is coated. The deposition used herein is selected from physical deposition (sputtering, evaporation, pulsed laser deposition), metalorganic chemical vapor deposition, chemical deposition (spray pyrolysis method), electroplating or cladding, alone or in combination (S60).

In any one layer among multi-layers of the metal protective layer 43, a metal or metal alloy layer having low electric conductivity may be includes selectively to greatly reduce the coupling loss during use with alternating current. In this case, the remaining layers may have stabilization and protection effect on the wire by being coated with a metal having high electric conductivity such as silver or copper.

The metal or metal alloy layer having low electric conductivity selectively uses a metal or a metal alloy having about 1/5 to 1/120 electric conductivity of silver or copper.

The final filament type high-temperature superconducting wire has a cross-sectional axial ratio defined between 1:1 to 1:2. Further, the filament type high-temperature superconducting wire is formed in various shapes such as a square or circle shape.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

As described above, the present invention fabricates a thin film type high-temperature superconducting wire in a filament shape with its cross-section in a square or approximately a square shape, and the AC loss is reduced since forming the same into a twisted shape is possible. The wire is also easily formed into a solenoid coil, a pancake coil, or a cable. The proportion of the superconductor occupying the total cross-sectional area, compared with the conventional tape-type superconducting wire, is increased by coating a ceramic buffer layer and a metal protective layer on the square surface of the thin film type high-temperature superconducting wire in a filament shape such that the area capable of flowing current is widened; thus even more current can be flown per unit area.

Furthermore, the fabricated wire in a filament shape reduces loss from demagnetization due to a small aspect ratio, and by twisting the wire the coupling loss during use with alternating current can reduce greatly.

What is claimed is:

1. A method for fabricating a filament type high-temperature superconducting wire using a metal substrate coated with a first ceramic layer and a second ceramic layer, and an ion beam assisted deposition (IBAD) layer having bi-axially textured property, and a third ceramic layer sequentially coated epitaxially the metal substrate, the method comprising:
   depositing a conductive material epitaxially on a metal substrate having bi-axially textured property to deposit a conductive thin film layer;
   depositing at least one of silver, copper, nickel, silver, or a nickel alloy epitaxially on the deposited conductive thin film layer to deposit a metal layer;
   cutting the deposited metal layer into a filament shape having a predetermined width using at least one of a laser, a slitter, or etching, and separating the cut metal layer from the conductive thin film layer by at least one of selective etching, stress generation, or a difference in thermal expansion coefficients to form a metal filament;
   coating at least one layer of a ceramic buffer layer on an outside surface of the separated metal filament;
   coating a superconducting layer on an outside surface of the ceramic buffer layer; and
   coating at least one layer of a metal protective layer on an outside surface of the superconducting layer.

2. The method according to claim 1, wherein the filament type high-temperature superconducting wire has a cross sectional axial ratio defined between 1:1 and 1:2.

3. The method according to claim 1, wherein the filament type high-temperature superconducting wire has one of a square or a circle shape.

4. The method according to claim 1, wherein the conductive thin film layer comprises one of silver, copper, or nickel, and is coated using at least one of: physical deposition including sputtering, evaporation, and pulsed laser deposition; metalorganic chemical vapor deposition; chemical deposition including spray pyrolysis method; electroplating; electroless deposition; or a combination thereof.

5. The method according to claim 1, wherein the metal layer is coated using at least one of: physical deposition including sputtering, evaporation, and pulsed laser deposition; metalorganic chemical vapor deposition; chemical deposition including spray pyrolysis method; electroplating; electroless deposition; or a combination thereof.

6. The method according to claim 1, wherein the ceramic buffer layer is coated using at least one of: physical deposition including sputtering, evaporation, and pulsed laser deposition; metalorganic chemical vapor deposition; chemical deposition including spray pyrolysis method; electroplating; electroless deposition; or a combination thereof.

7. The method according to claim 1, wherein the superconducting layer is coated using at least one of: physical deposition including sputtering, evaporation, and pulsed laser deposition; metalorganic chemical vapor deposition; chemical deposition including spray pyrolysis method; electroplating; electroless deposition; or a combination thereof.

8. The method according to claim 1, wherein the metal protective layer is coated using at least one of: physical deposition including sputtering, evaporation, and pulsed laser deposition; metalorganic chemical vapor deposition; chemical deposition including spray pyrolysis method; electroplating; electroless deposition; or a combination thereof.

9. The method according to claim 1, wherein each of the at least one layer of the metal protective layer comprises one of a metal or a metal alloy layer having low electric conductivity to reduce coupling loss between metal filaments.

10. The method according to claim 1, wherein the conductive thin film layer comprises an electrode material including a conductive ceramic, and is coated using at least one of: physical deposition including sputtering, evaporation, and pulsed laser deposition; metalorganic chemical vapor deposition; chemical deposition including spray pyrolysis method; electroplating; electroless deposition; or a combination thereof.

11. The method according to claim 10, wherein the conductive ceramic comprises one of ITO or FTO.

12. The method according to claim 1, wherein the conductive material comprises at least one of a metal, a conductive ceramic, or a combination thereof.

* * * * *